(12) United States Patent
Bae (10) Patent No.: US 10,131,077 B2
(45) Date of Patent: Nov. 20, 2018

(54) DEVICE FOR MOLDING SEMICONDUCTOR PACKAGE

(71) Applicant: Samsung Electronics Co., Ltd., Suwon-si, Gyeonggi-do (KR)

(72) Inventor: Kwang-jin Bae, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 58 days.

(21) Appl. No.: 15/332,233

(22) Filed: Oct. 24, 2016

(65) Prior Publication Data
US 2017/0217062 A1  Aug. 3, 2017

(30) Foreign Application Priority Data
Feb. 3, 2016 (KR) .................. 10-2016-0013534

(51) Int. Cl.
| | |
|---|---|
| *B29C 45/00* | (2006.01) |
| *B29C 45/14* | (2006.01) |
| *B29C 45/04* | (2006.01) |
| *B29C 45/26* | (2006.01) |
| *B29C 45/77* | (2006.01) |
| *B29C 45/78* | (2006.01) |
| *B29C 45/80* | (2006.01) |
| *H01L 21/56* | (2006.01) |
| *H01L 25/00* | (2006.01) |

(Continued)

(52) U.S. Cl.
CPC ........ *B29C 45/14819* (2013.01); *B29C 45/04* (2013.01); *B29C 45/2602* (2013.01); *B29C 45/56* (2013.01); *B29C 45/77* (2013.01); *B29C 45/78* (2013.01); *B29C 45/80* (2013.01); *H01L 21/565* (2013.01); *H01L 25/50* (2013.01); *B29C 2945/76498* (2013.01); *B29C 2945/76531* (2013.01); *B29C 2945/76568* (2013.01); *B29K 2105/0067* (2013.01); *B29L 2031/34* (2013.01); *B29L 2031/3493* (2013.01); *H01L 2924/181* (2013.01)

(58) Field of Classification Search
CPC .............................................. B29C 45/14819
See application file for complete search history.

(56) References Cited

U.S. PATENT DOCUMENTS

| | | |
|---|---|---|
| 8,236,621 B2 | 8/2012 | Sugai |
| 2009/0127732 A1 | 5/2009 | Tamura |

(Continued)

FOREIGN PATENT DOCUMENTS

| | | |
|---|---|---|
| JP | 2010-005848 A | 1/2010 |
| JP | 2011-014586 A | 1/2011 |

(Continued)

*Primary Examiner* — Timothy Kennedy
(74) *Attorney, Agent, or Firm* — Harness, Dickey & Pierce, P.L.C.

(57) ABSTRACT

A device for molding a semiconductor package including an upper mold configured to retain a substrate thereon, the substrate having semiconductor chips thereon, a lower mold defining a cavity and including a plurality of moving blocks, a bottom surface of the cavity defined by the moving blocks, the cavity configured to contain a molding resin, the moving blocks movably arranged under the cavity, a driving unit configured to movably drive the moving blocks, and a controller configured to control an raising order of the moving blocks by controlling the driving unit may be provided.

20 Claims, 9 Drawing Sheets

(51) Int. Cl.
    *B29C 45/56*     (2006.01)
    *B29K 105/00*     (2006.01)
    *B29L 31/34*     (2006.01)

(56) References Cited

U.S. PATENT DOCUMENTS

| | | |
|---|---|---|
| 2012/0061880 A1 | 3/2012 | Han |
| 2012/0308884 A1 | 12/2012 | Oguni et al. |
| 2015/0034984 A1* | 2/2015 | Shin .................... H01L 21/565 |
| | | 257/98 |

FOREIGN PATENT DOCUMENTS

| | | |
|---|---|---|
| JP | 2015-179829 A | 10/2015 |
| KR | 2010-0078961 A | 7/2010 |
| KR | 10-1111421 B1 | 2/2012 |
| KR | 10-1111430 B1 | 2/2012 |
| KR | 2012-0045789 A | 5/2012 |

* cited by examiner

DEVICE FOR MOLDING SEMICONDUCTOR PACKAGE

CROSS-REFERENCE TO RELATED APPLICATION

This application claims the benefit of Korean Patent Application No. 10-2016-0013534, filed on Feb. 3, 2016, in the Korean Intellectual Property Office, the disclosure of which is incorporated herein in its entirety by reference.

BACKGROUND

The inventive concepts relate to devices for molding a semiconductor package.

In order to avoid or mitigate damage to a semiconductor chip due to an external impact and/or light, a process of molding a semiconductor chip with a sealing resin such as an epoxy molding compound (EMC) has been performed. Recently, semiconductor products are becoming increasingly smaller, thinner, and/or lighter according to trends of the semiconductor industry, such that the semiconductor products can be highly integrated and/or can have a higher density. For example, a molding resin (interchangeably referred to as a sealing resin) as well as a semiconductor package including the molding resin is becoming increasingly thinner.

SUMMARY

The inventive concepts provide devices for molding a semiconductor package, which are capable of molding the semiconductor package with a small thickness, reducing voids in a molding resin, and/or reducing a frequency of occurrence of non-filling of the molding resin.

According to an example embodiment of the inventive concepts, a device for molding a semiconductor package includes an upper mold configured to retain a substrate thereon, the substrate having semiconductor chips thereon, a lower mold defining a cavity and including a plurality of moving blocks, a bottom surface of the cavity defined by the moving blocks, the cavity configured to contain a molding resin, the moving blocks movably arranged to define the bottom surface, a driving unit configured to movably drive the moving blocks and a controller configured to control an moving order of the moving blocks by controlling the driving unit.

According to an example embodiment of the inventive concepts, a device for molding a semiconductor package includes an upper mold configured to retain a substrate, the substrate having semiconductor chips thereon, a lower mold defining a cavity and including a plurality of moving blocks, the cavity configured to contain a molding resin, a bottom surface of the cavity defined by the moving blocks, each of the moving blocks configured to move between a first level and a second level higher than the first level, a driving unit configured to movably drive each of the moving blocks between the first level and the second level, and a controller configured to control a first order by which respective ones of the moving blocks ascend, temperatures of the moving blocks, and pressures applied to the molding resin by respective ones of the moving blocks.

According to an example embodiment of the inventive concepts, a device for molding a semiconductor package includes an upper mold configured to retain a substrate thereon, the substrate including at least one semiconductor chip thereon, a lower mold including a plurality of moving blocks and at least one outer circumferential structure, the moving blocks and the at least one outer circumferential structure defining a cavity, the molding blocks configured to ascend and descend, the moving blocks defining a bottom surface of the cavity, and the outer circumferential structure defining a sidewall of the cavity, and a controller configured to control an order by which respective ones of the moving blocks ascend and descend

BRIEF DESCRIPTION OF THE DRAWINGS

Some example embodiments of the inventive concepts will be more clearly understood from the following detailed description taken in conjunction with the accompanying drawings in which:

FIGS. 4A(a), 4A(b), 4A(c) and 4B are graphs for describing a method of molding a semiconductor package, by using a temperature controller of FIG. 1;

DETAILED DESCRIPTION

Figure 1:
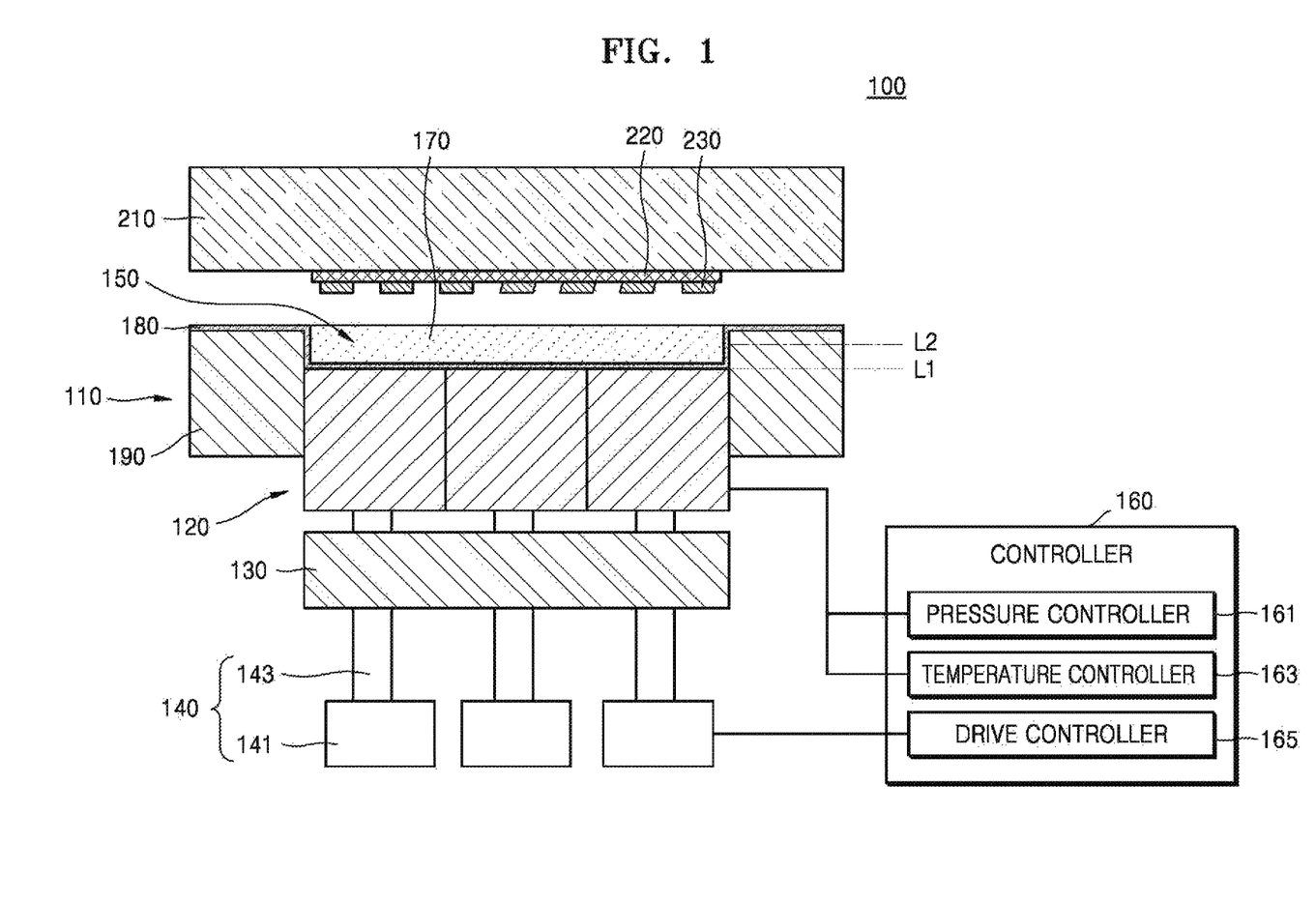
FIG. 1 is a cross-sectional view illustrating parts of a device for molding a semiconductor package according to an example embodiment of the inventive concepts.

FIG. 1 is a cross-sectional view illustrating parts of a device 100 for molding a semiconductor package according to an example embodiment of the inventive concepts.

Referring to FIG. 1, the device 100 for molding the semiconductor package may include an upper mold 210, a lower mold 110, a driving unit 140, and a controller 160. The device 100 for molding the semiconductor package may be used for a molding process for encapsulating a substrate 220 and semiconductor chips 230 with a molding resin. The molding process may be performed using various methods, for example, a transfer molding method or a compression molding method.

The upper mold 210 and the lower mold 110 may face each other and a distance between the upper mold 210 and the lower mold 110 may be adjusted. The upper mold 210 may have suction holes (not shown) exposed at which the substrate 220 is mounted, and may retain the substrate 220 on the upper mold 210 by decompressing the suction holes by using, for example, a vacuum pump. A plurality of semiconductor chips 230 may be arranged on a first surface of the substrate 220, the first surface being a surface opposite to a second surface facing the upper mold 210. A semiconductor chips 230 may be electrically connected to the substrate 220 by, for example, flip chip bonding or wire bonding. Furthermore, the semiconductor chips 230 may be multi-chips having a structure in which at least two semiconductor chips 230 are stacked. For example, the at least two semiconductor chips 230 may be memory devices of one type. In some example embodiments, one of the at least two semiconductor chips 230 may be a memory device and the other of the at least two semiconductor chips 230 may be a micro-controller device.

The lower mold 110 may include a cavity 150 having a desired (or alternatively, prescribed) depth so that the molding resin 170 can be filled therein, and an outer circumferential portion 190 arranged at a side of the cavity 150, a moving block 120 arranged under the cavity 150, and a supporting block 130 supporting the moving block 120 under the moving block 120, for example, at a side opposite to the cavity 150 with respect to the moving block 120.

The cavity 150 may be formed in a region corresponding to the substrate 220 retained on the upper mold 210. During a molding process, at least a portion of the substrate 220 and at least a portion of the semiconductor chips 230 may be immersed in the molding resin 170, which fills the cavity 150. The side of the cavity 150 may be supported or defined by the outer circumferential portion 190 of the lower mold 110, and a bottom surface of the cavity 150 may be supported or defined by the moving block 120. In other words, the outer circumferential portion 190 may define a side surface of the cavity 150, and the moving block 120 may define a bottom surface of the cavity 150. A depth of the cavity 150 may change according to a vertical movement of the moving block 120.

The moving block 110 may be provided in plurality. In other words, the lower mold 110 may include a plurality of moving blocks 120. The moving blocks 110 may be configured to move in a vertical direction. Each of the moving blocks 120 may constitute at least a portion of the bottom surface of the cavity 150, and a pressure applied to the molding resin 170 may be partially increased by raising (e.g., moving upward or ascending) some of the moving blocks 120 during a molding process. Although not specifically illustrated, the moving blocks 120 may be arranged in one direction. In some example embodiments, at least one of the moving blocks 120 may be surrounded by some neighboring ones of the moving blocks 120 in multiple layers. In some example embodiments, the moving blocks 120 may be arranged in at least two rows and at least two columns. Furthermore, the moving blocks 120 may be differently arranged from the foregoing arrangements. Furthermore, the moving block 120 may have a polygonal pillar shape (e.g., a rectangle pillar shape or may have a circular pillar shape).

The driving unit 140 may raise or lower (e.g., ascend or descend) the moving block(s) 120. The driving unit 140 may independently move each of the moving blocks 120. For example, the driving unit 140 may include a drive motor 141, and a rod or rods 143 connecting the drive motor 141 and the moving block(s) 120.

The rod 143 connecting the drive motor 141 and the moving block 120 may include an elastic member such as a spring. The rod 143 may transmit power generated in the drive motor 141 to the moving block 120, and an elastic member in the rod 143 may mitigate or prevent the pressure applied to the molding resin 170 from rapidly increasing or decreasing. Furthermore, the rod 143 including an elastic member may effectively transmit power generated in the drive motor 141 to the moving block 120.

During a molding process, the moving block(s) 120 may be risen (e.g., ascend) from a first level L1 to a second level L2, which is higher than the first level L1. The second level L2 may be a height for determining pressure to be applied to the molding resin 170 during curing of the molding resin 170.

The supporting block 130 may be located between the moving block(s) 120 and the drive motor 141, and may be raised or lowered by the driving unit 140. A surface of the supporting block 130, facing the moving block 120, may be a planar shape. The supporting block 130 may be aligned with the moving blocks 120 and support lower portions of the moving blocks 120.

A release film 180 may be located on a surface of the lower mold 110 facing the upper mold 210. The release film 180 may attached to a surface of the lower mold 110 by decompressing a gap between the outer circumferential portion 190 of the lower mold 110 and the moving block 120 by using a vacuum pump. Left and right portions of the release film 180, not shown in FIG. 1, may be respectively wound round a winding roll, and the release film 180 may be moved from left to right or right to left by rotating the winding roll. Therefore, when a new molding process is underway, the winding roll may be rotated so that a portion of the release film 180 is located on the lower mold 110.

The molding resin 170 may fill the cavity 150. The molding resin 170, for example, may be a thermoplastic resin or a thermosetting resin. The resin, for example, may be a granular resin, a powdered resin, a liquid resin, a plate-shaped resin, a sheet-shaped resin, a film-shaped resin, a paste resin, or any one of combinations of the above resins. Furthermore, the resin, for example, may be a transparent resin, a semi-transparent resin, a non-transparent resin, or any one of combinations of the above resins.

The controller 160 may include, for example, a pressure controller 161, a temperature controller 163, and a drive controller 165. The drive controller 165 may control a rising (e.g., ascending) order, a rising (e.g., ascending) height, and a rising (e.g., ascending) speed of each of the moving blocks 120. The temperature controller 163 may adjust a temperature of each of the moving blocks 120 by using, for example, a temperature adjusting member (e.g., a heat wire) provided in each of the moving blocks 120.

The pressure controller 161 may adjust a pressure applied to the molding resin 170 from each of the moving blocks 120. The pressure controller 161 may control the pressure applied to the molding resin 170 by adjusting, for example, a torque value of the drive motor 141. In some example embodiments, the pressure controller 161 may control the pressure applied to the molding resin 170 by adjusting, for example, rising (e.g., ascending) heights of the moving blocks 120.

Furthermore, the controller 160 may adjust a rising (e.g., ascending) speed of each of the moving blocks 120. For example, in order to increase a flow speed of the molding resin 170 in a specific portion of the cavity 150, the controller 160 may increase rising (e.g., ascending) speed(s) of one or more of the moving blocks 120 corresponding to the specific portion of the cavity 150. Meanwhile, in order to reduce the flow speed of the molding resin 170 in a specific portion of the cavity 150, the controller 160 may reduce the rising (e.g., ascending) speed(s) of one or more of the moving blocks 120 corresponding to the specific portion of the cavity 150.

A method of controlling an order in hick the moving blocks 120 are individually risen by the controller 160, and a method of controlling a temperature of each of the moving blocks 120 will be described in detail later below.

Figure 2:
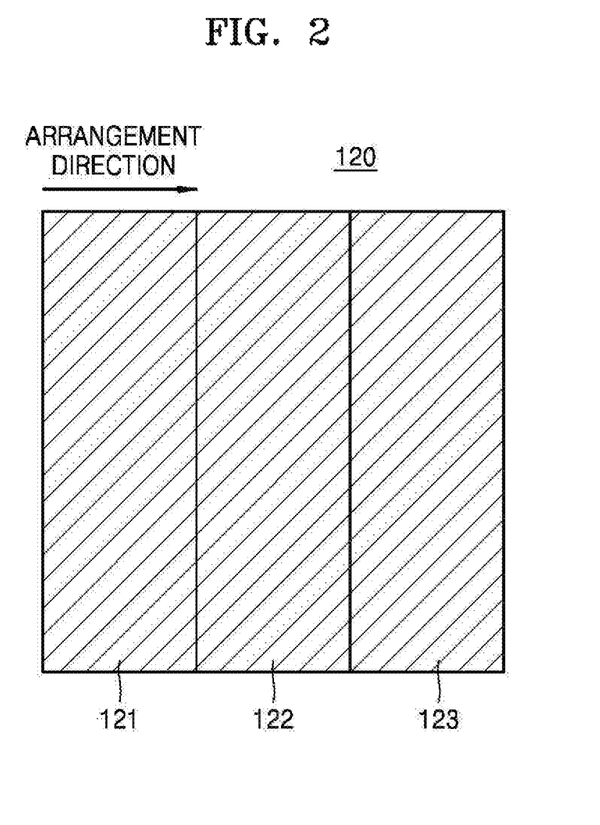
FIG. 2 is a plan view illustrating moving blocks according to an example embodiment of the inventive concepts.

FIG. 2 is a plan view illustrating moving blocks according to an example embodiment of the inventive concepts. FIG. 3 is cross-sectional views illustrating parts of the device 100 for molding the semiconductor package to explain an operation of the moving blocks of FIG. 2.

Referring to FIG. 2, moving blocks 120 may include first to third moving blocks 121 to 123 arranged in an arrangement direction (for example, a first direction), which crosses with a moving direction of the moving block 120. For example, the first to third moving blocks 121 to 123 may be sequentially arranged in the first direction from a left side of FIG. 2. However, the number of the moving blocks 121 to 123 may not be limited thereto, and may be two, four, or more.

Furthermore, respective areas of the moving blocks 121 to 123 contacting the cavity 150 may be the same size as each other. In some example embodiments, respective areas of the moving blocks 121 to 123 contacting the cavity 150 may be different from each other. For example, an area of the second moving block 122 in a center portion may be larger than an area of the first moving block 121 or the third moving block 123 at an edge. On the other hand, an area of a moving block at an edge may be larger than an area of a moving block in a center portion.

Hereinafter, a method of molding a semiconductor package using the device 100 for molding the semiconductor package, according to some example embodiments of the inventive concepts, will be described with reference to FIGS. 1 to 3.

Figure 3A:
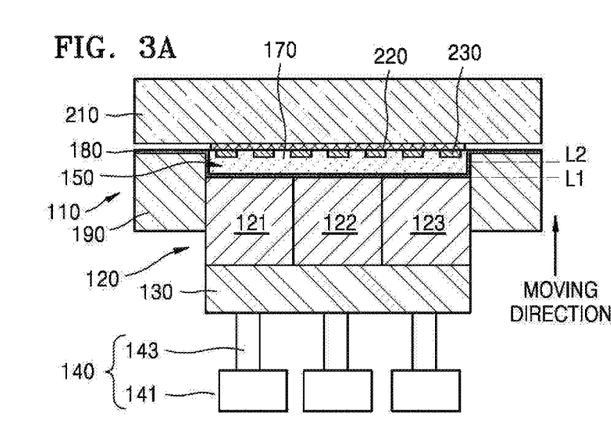
FIGS. 3A, 3B, 3C, and 3D are cross-sectional views illustrating parts of a device for molding a semiconductor package to explain an operation of the moving blocks of FIG. 2.

First, FIG. 3A shows that an upper mold 210 and a lower mold 110 are arranged at regular intervals and facing each other. A first surface of a substrate 220 may be retained on the upper mold 210. Semiconductor chips 230 may be arranged on a second surface of the substrate 220, and the second surface of the substrate 220 may be opposite to the first surface of the substrate 220, which is retained on the upper mold 210. Furthermore, a release film 180 may be located on a surface of the lower mold 110 facing the upper mold 210.

A molding resin 170 may be injected in a cavity 150 of the lower mold 110. The molding resin 170, in a state before being cured, may be a fluid resin. The fluid resin, for example, may be a liquid resin, and furthermore, may be in a molten state resulting from heating and melting a solid resin (e.g., a granular resin, a powdered resin, or a paste resin).

A distance between the upper mold 210 and the lower mold 110 may be adjusted so that the substrate 220 and the semiconductor chips 230 may be immersed in the molding resin 170. Moving blocks 121 to 123 may be aligned at a first level L1, and a supporting block 130 may support the moving blocks 121 to 123. In order to adjust the distance between the upper mold 210 and the lower mold 110, one of the upper mold 210 and the lower mold 110 may ascend or descend, or both the upper mold 210 and the lower mold 110 may move together. Here, a sealing member (not shown) such as an O-ring may be arranged in a gap between the upper mold 210 and the lower mold 110.

Figure 3B:
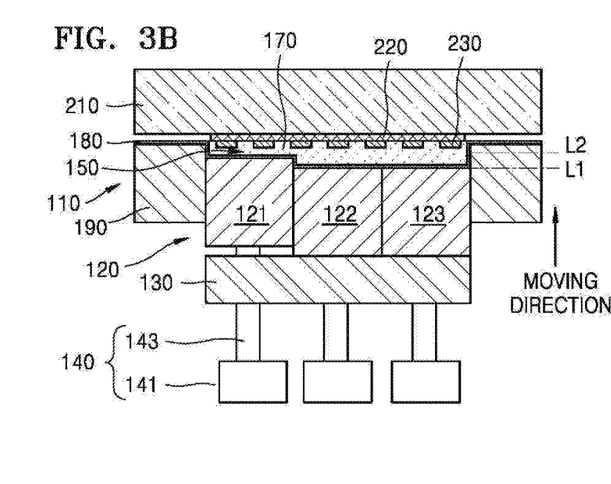
Figure 3C:
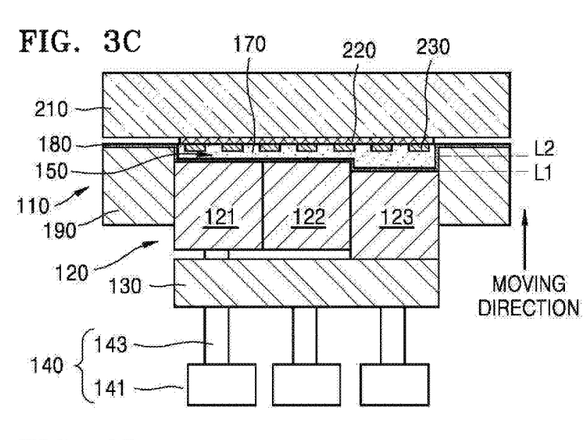
Figure 3D:
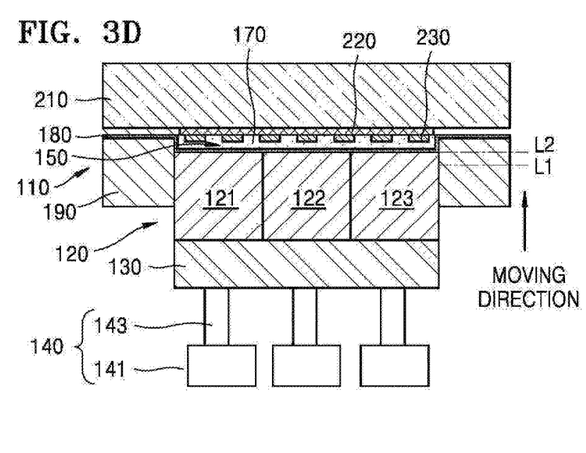

Next, the controller 160 may apply a control signal to a driving unit 140 and may move the moving blocks 121 to 123 from the first level L1 to a second level L2 in a certain order. As illustrated in FIGS. 3B to 3D, the moving blocks 121 to 123 may ascend in an order that the moving blocks 121 to 123 are arranged. For example, the first moving block 121 at the leftmost side may be moved from the first level L1 to the second level L2, the second moving block 122 contacting (or adjacent to) the first moving block 121 may ascend from the first level L1 to the second level L2, and the third moving block 123 contacting (or adjacent to) the second moving block 122 may ascend from the first level L1 to the second level L2.

As the first moving block 121 at the leftmost side ascend as illustrated in FIG. 3B, a distance between the first moving block 121 and the substrate 220 becomes narrower at a left portion of the cavity 150, and a pressure applied to the molding resin 170 at the left portion of the cavity 150 may increase. Furthermore, the molding resin 170 filling the left portion of the cavity 150 may flow from left to right, and a void formed in the molding resin 170 may also move to the right along with the flow of the molding resin 170. Next, when the second moving block 122 and the third moving block 123 sequentially ascend as illustrated in FIGS. 3C and 3D, the molding resin 170 may flow from left to right in the cavity 150.

As the molding resin 170 flows in the cavity 150, the void in the molding resin 170 may also move. While the void moves, gas forming the void may be leaked from the molding resin 170 and may be exhausted to outside through a gas exhaust port (not shown) formed in the upper mold 210 or the lower mold 110. The void may move from left to right which is the same as a flow direction of the molding resin 170, and gas forming the void may be exhausted mainly in a right direction of the cavity 150. Furthermore, as the molding resin 170 is provided with fluidity before being cured, a frequency of occurrence of poor filling such as non-filling in a specific portion of the molding resin 170 may be reduced.

Meanwhile, the controller 160, in order to raise the third moving block 123 that ascends last, may raise the supporting block 130 as illustrated in FIG. 3D. When the supporting block 130 ascends, the third moving block 123 may be risen from the first level L1 to the second level L2 by the supporting block 130. Furthermore, the supporting block 130, which has, for example, a plate-like shape, may align the moving blocks 121 to 123 in the second level L2 by simultaneously supporting the same. In some example embodiments, the controller 160, after the third moving block 123 ascends from the first level L1 to the second level L2, may align the moving blocks 121 to 123 by raising the supporting block 130, separately.

Figure 4A:
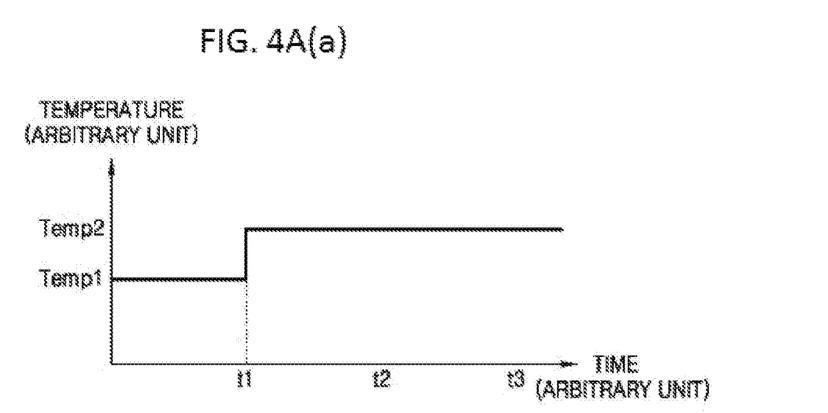

FIGS. 4A(a), 4A(b), 4A(c), and 4B are graphs for describing a method of molding a semiconductor package, by using the temperature controller 163 of FIG. 1.

Referring to FIGS. 4A(a), 4A(b), 4A(c), together with FIGS. 1 and 3A to 3D, a method of molding a semiconductor package according to an example embodiments of the inventive concepts will now be described. FIGS. 4A(a) to 4A(c) schematically illustrate temperature changes of the first to third moving blocks 121 to 123, respectively, during a molding process. Furthermore, the first to third moving blocks 121 to 123 may sequentially rise (e.g., ascend) in an arrangement direction as illustrated in FIGS. 3A to 3D, and points in time that the first to third moving blocks 121 to 123 rise or ascend from the first level L1 to the second level L2 may be first to third points in time t1 to t3, respectively.

The temperature controller 163, by applying a control signal to a temperature adjusting member (not shown) in each of the moving blocks 121 to 123, may independently change a temperature of each of the moving blocks 121 to 123. For example, the temperature controller 163 may heat the moving blocks 121 to 123 from a first temperature Temp1 to a second temperature Temp2, and may adjust points in time of heating or cooling the moving blocks 121 to 123. The molding resin 170 may be cured at the second temperature Temp2 but not at the first temperature Temp1. The first and second temperatures Temp1 and Temp2 may be changed according to a type of the molding resin 170.

As illustrated in FIGS. 4A (a) to 4A (c), the temperature controller 163 may raise temperatures of the moving blocks 121 to 123 to a curing temperature of the molding resin 170 or higher, in an order of reaching the second level L2 of the moving blocks 121 to 123. For example, the temperature controller 163 may increase a temperature of the first moving block 121, which is risen to the second level L2 first, from a first temperature Temp1 to a second temperature Temp2 at a first point in time t1, may increase a temperature of the second moving block 122 from the first temperature Temp1 to the second temperature Temp2 at a second point in time t2, and may increase a temperature of the third moving block 123 from the first temperature Temp1 to the second temperature Temp2 at a third point in time t3.

The pressure and temperature of the molding resin 170 may partially increase as the first moving block 121 rises first, and thus the molding resin 170 of the cavity 150 may be cured from the left side first. Similarly, each of the second and third moving blocks 122 and 123 may be simultaneously heated at a rising time subsequent to the rising time of the first moving block 121, and thus the molding resin 170 of the cavity 150 may be cured from the left side first.

Figure 4B:
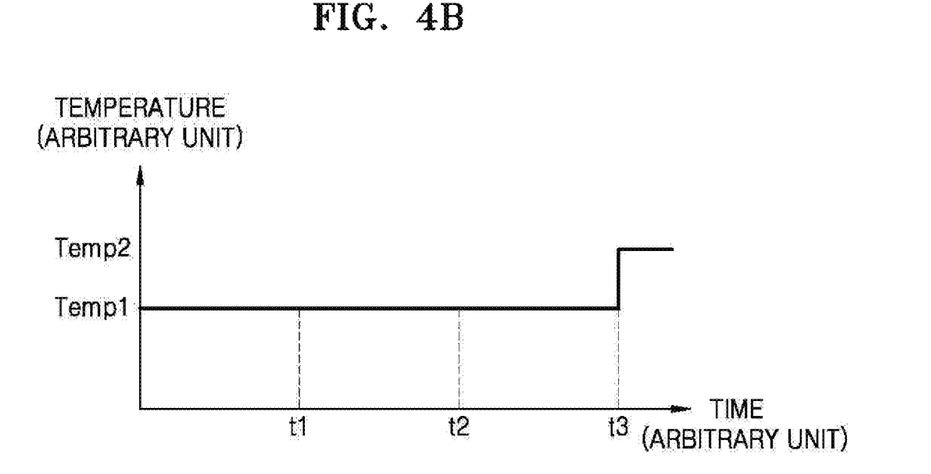

Meanwhile, referring to FIG. 4B as well as FIGS. 1 to 3A, 3B, 3C, and 3D, a method of molding a semiconductor package according to some example embodiments of the inventive concepts will be described. The method may be substantially the same as that of FIGS. 4A(a), 4A(b), and 4A(c) except for a temperature control method using the temperature controller 163. Thus, repeated descriptions thereof will not be given for convenience of descriptions.

The temperature controller 163, after all of the moving blocks 121 to 123 moves from the first level L1 to the second level L2, may simultaneously heat the moving blocks 121 to 123 from the first temperature Temp1 to the second temperature Temp2. For example, regardless of points in time at which the first to third moving blocks 121 to 123 are risen from the first level L1 to the second level L2, respectively, the temperature controller 163 may increase temperatures of the first to third moving blocks 121 to 123 after all of the first to third moving blocks 121 to 123 reaches the second level L2. Therefore, every side of the molding resin 170 may be simultaneously cured in the cavity 150.

Figure 5A:
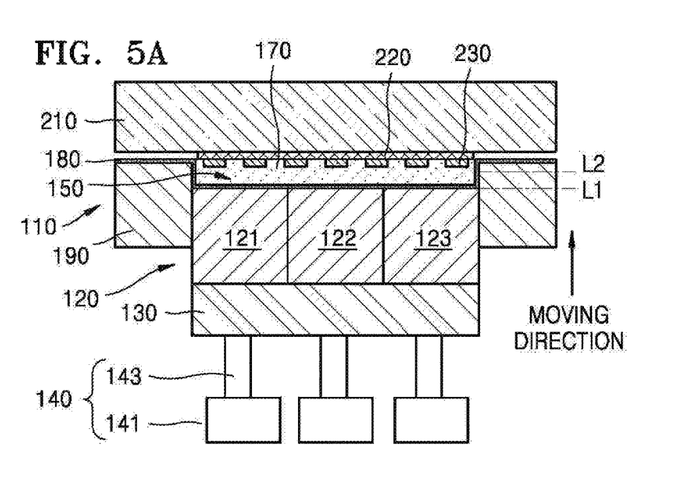
FIGS. 5A to 5C are cross-sectional views illustrating parts of a device for molding a semiconductor package, for describing an operation of the moving block of FIG. 2.
Figure 5B:
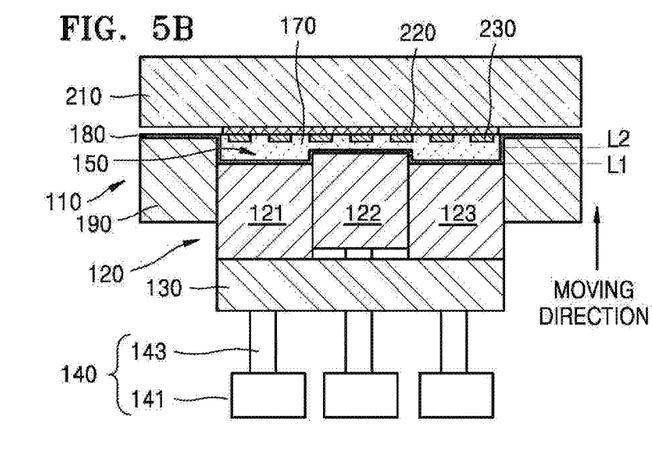
Figure 5C:
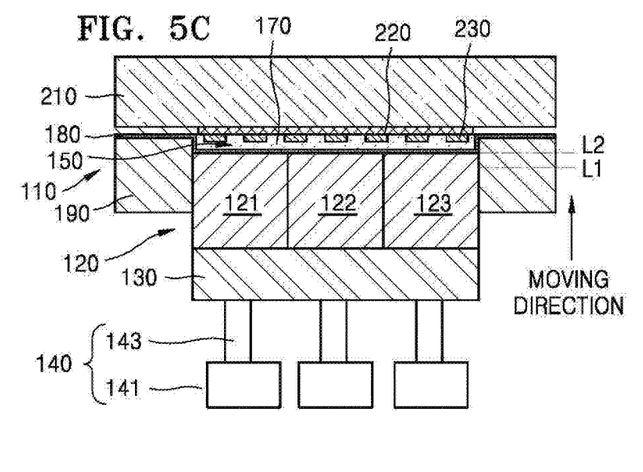

FIGS. 5A to 5C are cross-sectional views illustrating parts of the device 100 for molding a semiconductor package, for describing an operation of the moving block of FIG. 2.

Referring to FIGS. 5A to 5C as well as FIGS. 1, 3A, 3B, 3C, and 3D, the device 100 for molding the semiconductor package may be substantially the same as those of FIGS. 1 and 3A to 3D except for the rising order of the moving blocks 121 to 123. Thus, detailed descriptions of the structure of the device 100 will not be given for convenience of descriptions.

The controller 160 may apply a control signal to a driving unit 140 and move the moving blocks 121 to 123 from the first level L1 to the second level L2, and may control the rising (e.g., ascending) order of the moving blocks 121 to 123. As illustrated in FIG. 5A, the moving blocks 121 to 123 are initially at the first level L1. As illustrated in FIGS. 5B and 5C, the controller 160 may raise the second moving block 122 arranged in the middle of the moving blocks 121 to 123 first, and may sequentially raise other moving blocks in left and right side of the second moving block 122. For example, the second moving block 122 arranged in the middle of the moving blocks 121 to 123 may be moved first from the first level L1 to the second level L2, and the first moving block 121 and the third moving block 123 arranged in both sides of the second moving block 122 may be moved from the first level L1 to the second level L2 next. The first and third moving blocks 121 and 123 may simultaneously rise or may separately rise.

As the first and third moving blocks 121 and 123 arranged in both sides of the second moving block 122 may rise after the second moving block 122, the molding resin 170 may flow to the left and right sides of the second moving block 122. The flow of the molding resin 170 may exhaust gas forming a void to outside, and thus an occurrence of non-filling in a specific portion of the molding resin 170 may be reduced.

Furthermore, in some example embodiments, unlike the rising order of moving blocks 120 illustrated in FIGS. 5A to 5C, for example, the first and third moving blocks 121 and 123 arranged in both sides of the second moving block 122 may be risen first from the first level L1 to the second level L2, and the second moving block 122 arranged in the middle of the moving blocks 121 to 123 may be risen next. Here, the molding resin 170 may flow from both ends of the cavity 150 to the center portion thereof.

The temperature controller 163, by applying a control signal to a temperature adjusting member in each of the moving blocks 121 to 123, may change a temperature of each of the moving blocks 121 to 123. For example, the temperature controller 163 may heat the moving blocks 121 to 123 from a first temperature Temp1 to a second temperature Temp2, and the second temperature Temp2 may be a curing temperature of the molding resin 170 or higher.

Furthermore, the temperature controller 163 may adjust a point in time of curing the molding resin 170 in the cavity 150 by adjusting a point in time when a temperature of each of the moving blocks 121 to 123 changes. For example, the temperature controller 163 may sequentially heat the moving blocks 121 to 123 in an order of the moving blocks 121 to 123 reaching the second level L2 from the first level L1. In some example embodiments, the temperature controller 163 may sequentially or simultaneously heat the moving blocks 121 to 123 after all of the moving blocks 121 to 123 are arranged at the second level L2.

However, the number of the moving blocks arranged in a direction crossing a moving direction of the moving block 120 is not limited to three as illustrated in FIGS. 5A to 5C, and may be two, four, or more.

Figure 6:
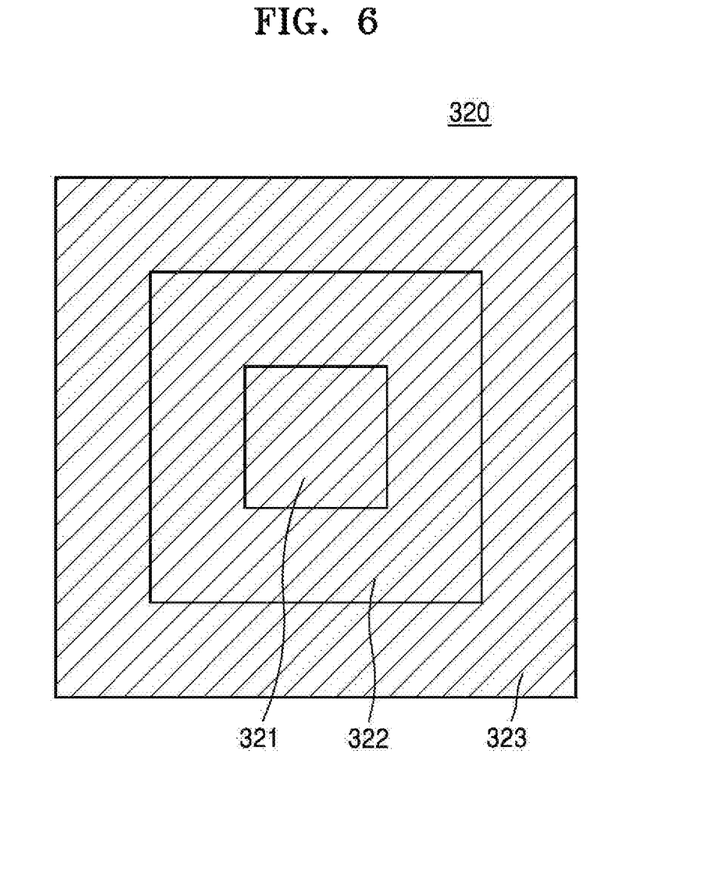
FIG. 6 is a plan view illustrating a moving block according to an example embodiment of the inventive concepts.

FIG. 6 is a plan view illustrating a moving block 320 according to an example embodiment of the inventive concepts. FIGS. 7A to 7D cross-sectional views illustrating parts of a device for molding a semiconductor package, for describing an operation of a moving block 320 of FIG. 6.

Referring to FIG. 6, the moving block 320 may include a moving block arranged in the middle of a plurality of moving blocks, and one moving block or at least two moving blocks surrounding the moving block arranged in the middle of the moving blocks. For example, as illustrated in FIG. 6, the moving block 320 may include a first moving block 321 arranged in the middle of moving blocks, a second moving block 322 surrounding the first moving block 321, and a third moving block 323 surrounding the second moving block 322. However, the number of the moving blocks is not limited thereto, and may be two, four, or more.

Hereinafter, referring to FIGS. 1, 6 and 7A to 7D, a method of molding a semiconductor package by using the device 100 for molding the semiconductor package according to some example embodiments of the inventive concepts will be described. The device 100 for molding the semiconductor package illustrated in FIGS. 6 and 7A to 7D may be substantially the same as that of FIG. 1 except for the rising order of the first to third moving blocks 321 to 323. Thus, detailed descriptions of the structure of the device 100 will not be given for convenience of descriptions.

Figure 7A:
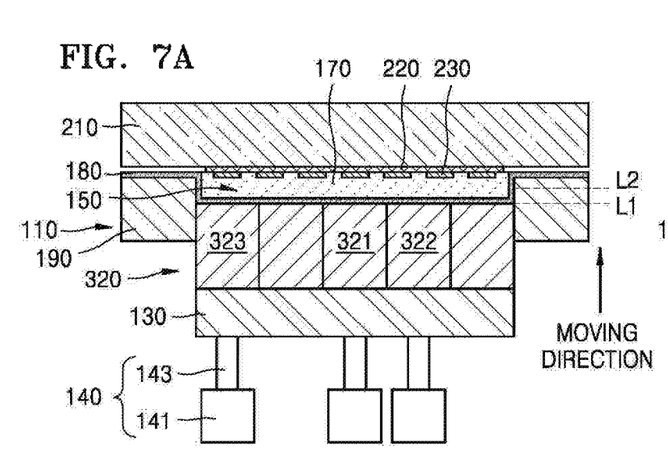
FIGS. 7A to 7D are cross-sectional views illustrating parts of a device for molding a semiconductor package, for describing an operation of the moving block of FIG. 6.

As illustrated in FIG. 7A, an upper mold 210 and a lower mold 110 are prepared. A substrate 220, including semiconductor chips 230 on a surface thereof, may be retained on the upper mold 210 and a molding resin 170 may be filled in a cavity 150 formed in the lower mold 110. A distance between the upper mold 210 and the lower mold 110 may be adjusted so that at least a part of the substrate 220 and the semiconductor chips 230 may be immersed in the molding resin 170.

Figure 7B:
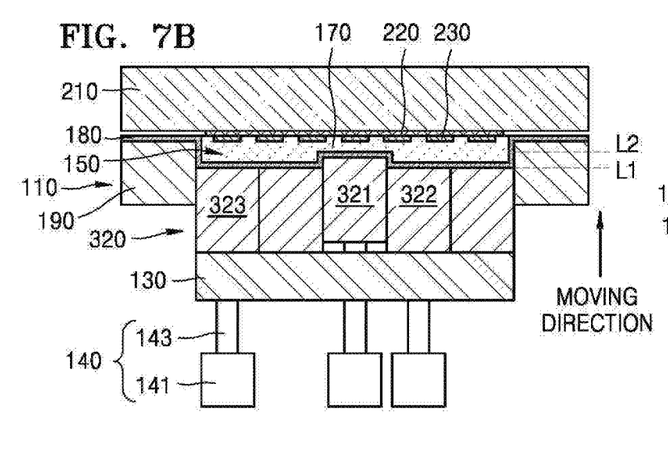
Figure 7C:
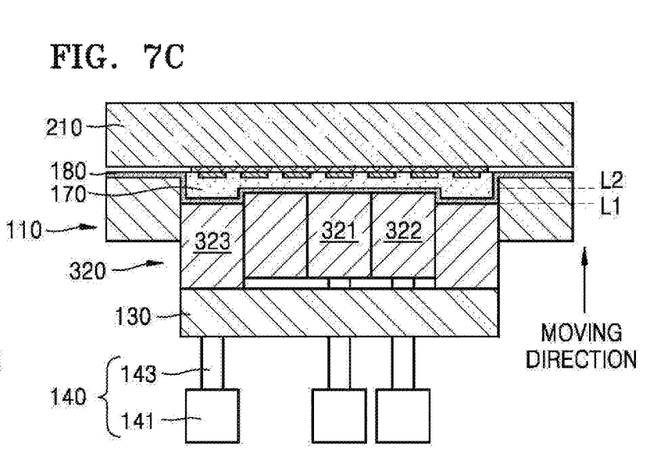
Figure 7D:
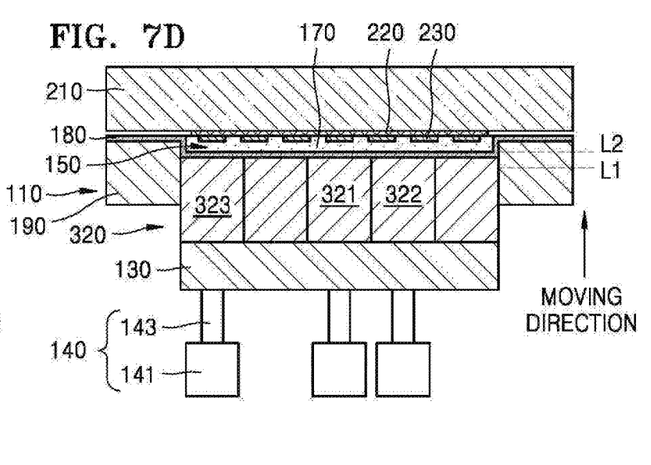

Next, as illustrated in FIGS. 7B to 7D, for example, the first moving block 321 arranged in the middle of the first to third moving blocks 321 to 323 may be risen first, and other moving blocks may be risen in an order of proximity to the first moving block 321 in a direction from a center portion of the first moving block 321 to the third moving block 323. For example, the first moving block 321 arranged in the middle of the first to third moving blocks 321 to 323 may be risen first from a first level L1 to a second level L2, next, the second moving block 322 contacting the first moving block 321 may be risen, and the third moving block 323 contacting the second moving block 322 may be risen last. In other words, the first to third moving blocks 321 to 323 may sequentially rise in a direction from the center portion of the first to third moving blocks 321 to 323 to edges of the first to third moving blocks 321 to 323.

As the first moving block 321 in the middle of the first to third moving blocks 321 to 323 rises as illustrated in FIG. 7B, a distance between the moving block 320 and the substrate 220 becomes narrower a center portion of the cavity 150, and a pressure applied to the molding resin 170 from the center portion of the cavity 150 may partially increase. Therefore, the molding resin 170 filling the center portion of the cavity 150 may flow to edges thereof. Next, when the second moving block 322 and the third moving block 323 sequentially rise as illustrated in FIGS. 7C and 7D, the molding resin 170 may further flow from the center portion of the cavity 150 to the edges thereof in the cavity 150.

Furthermore, in some example embodiments, unlike the rising order of the first to third moving blocks 321 to 323 illustrated in FIGS. 7A to 7D for example, the third moving block 323, the outermost one from among the first to third moving blocks 321 to 323, may be risen first, and other moving blocks may be risen in an order of proximity to the third moving block 323 in a direction from the edges of the first to third moving blocks 321 to 323 to the center portion thereof. For example, the third moving block 323 that is an outermost one from among the first to third moving blocks 321 to 323 may be risen first from the first level L1 to the second level L2, the second moving block 322 contacting or neighboring the third moving block 323 may be risen from the first level L1 to the second level L2, and the first moving block 321 surrounded by the second moving block 322 may be risen last from the first level L1 to the second level L2. Here, the molding resin 170 may flow in a direction from the edges of the cavity 150 to the center portion thereof in the cavity 150.

The temperature controller 163, by applying a control signal to a temperature adjusting member in each of the moving blocks 321 to 323, may change a temperature of each of the moving blocks 321 to 323. For example, the temperature controller 163 may heat the moving blocks 321 to 323 from a first temperature Temp1 to a second temperature Temp2, and the second temperature Temp2 may be a curing temperature of the molding resin 170 or higher.

Furthermore, the temperature controller 163 may adjust a point in time of curing the molding resin 170 in the cavity 150 by adjusting a point in time when a temperature of each of the moving blocks 321 to 323 changes. For example, the temperature controller 163 may sequentially heat the moving blocks 321 to 323 in an order of the moving blocks 321 to 323 reaching the second level L2 from the first level L1. In some example embodiments, the temperature controller 163 may sequentially or simultaneously heat the moving blocks 321 to 323 after all of the moving blocks 321 to 323 is arranged at the second level L2.

However, the number of the moving blocks is not limited to three as illustrated in FIG. 7, and may be two, four, or more.

Figure 8:
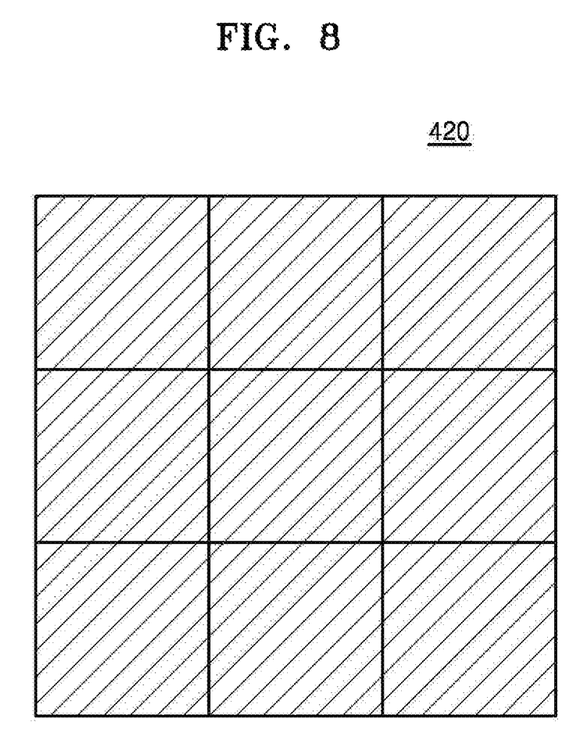
FIG. 8 is a plan view illustrating a moving block according to an example embodiment of the inventive concepts.

FIG. 8 is a plan view illustrating a moving block 420 according to an example embodiment of the inventive concepts.

Referring to FIGS. 1 and 8, the moving block 420 in the lower mold 110 may include a plurality of moving blocks arranged in at least two rows and at least two columns. For example, as illustrated in FIG. 8, the moving block 420 may include a plurality of moving blocks arranged in three rows and three columns.

Furthermore, respective areas of the moving blocks contacting the cavity 150 may be the same size as each other. In some example embodiments, respective areas of the moving blocks contacting the cavity 150 may be different from each other. For example, an area of a moving block in a center portion may be larger than an area of moving blocks at an edge. In some example embodiments, an area of the moving block at an edge may be larger than an area of the moving block in a center portion. In some example embodiments, moving blocks arranged along one of rows or columns may be larger than moving blocks arranged along other rows or columns.

The controller 160 may control the rising order of the moving blocks. For example, the controller 160 may raise the moving blocks in a direction from a center portion of the moving block 420 to edges thereof, or may raise the moving blocks in a direction from the edges of the moving blocks to the center portion thereof. In some example embodiments, the controller 160 may raise the moving blocks in a direction from an edge of the moving block 420 to an opposite edge thereof.

Furthermore, the controller 160 may independently change a temperature of each of the moving blocks. As described above, the controller 160, after all of the moving blocks rises from the first level L1 to the second level L2, may raise temperatures of the moving blocks to a curing temperature of the molding resin 170 or higher. In some example embodiments, the controller 160 may raise temperatures of the moving blocks to a curing temperature of the molding resin 170 or higher, in an order of reaching a second level L2 of the moving blocks.

While the inventive concepts have been particularly shown and described with reference to some example embodiments thereof, it will be understood that various changes in form and details may be made therein without departing from the spirit and scope of the following claims.

What is claimed is:

1. A device for molding a semiconductor package, the device comprising:
 an upper mold configured to retain a substrate thereon, the substrate having semiconductor chips thereon;
 a lower mold defining a cavity, the lower mold including
  an outer circumferential portion defining a sidewall of the cavity and a plurality of moving blocks defining a bottom surface of the cavity, the cavity configured to contain a molding resin;

a driving unit configured to independently move each of the moving blocks; and a controller configured to control an moving order of the moving blocks by controlling the driving unit.

2. The device for molding claim 1, wherein the lower mold further includes an outer circumferential structure defining a sidewall of the cavity.

3. The device for molding claim 1, wherein the moving blocks are arranged in a first direction that crosses moving direction of the moving blocks.

4. The device for molding claim 3, wherein the controller is configured to raise the moving blocks in an arrangement order thereof in the first direction.

5. The device for molding claim 3, wherein the controller is configured to raise one of the moving blocks in a center portion of the moving blocks first, and raise other ones of the moving blocks in an order of proximity to the one of the moving blocks in the center portion.

6. The device for molding claim 1, wherein the moving blocks include a central moving block in a center portion of the moving blocks, and one or more moving blocks surrounding the central moving block.

7. The device for molding claim 6, wherein the controller is configured to raise the central moving block first, and raise the one or more moving blocks in an order of proximity to the central moving block in a direction from the center portion of the moving blocks to edges of the moving blocks.

8. The device for molding claim 6, wherein the controller is configured to raise an outermost moving block from among the moving blocks first, and raise other moving blocks from among the moving blocks in an order of proximity to the outermost moving block in a direction from edges of the moving blocks to a center portion thereof.

9. The device for molding claim 1, wherein
the lower mold further includes a supporting block configured to support the moving blocks at a side opposite to the cavity with respect to the moving blocks, and
the driving unit is further configured to move the supporting block in a vertical direction.

10. The device for molding claim 1, wherein the controller comprises,
a pressure controller configured to adjust a pressure applied to the molding resin by each of the moving blocks, and
a temperature controller configured to control a temperature of each of the moving blocks.

11. A device for molding a semiconductor package, the device comprising:
an upper mold configured to retain a substrate, the substrate having semiconductor chips thereon;
a lower mold defining a cavity, the lower mold including an outer circumferential portion defining a sidewall of the cavity and a plurality of moving blocks defining a bottom surface of the cavity, the cavity configured to contain a molding resin, each of the moving blocks configured to move between a first level and a second level higher than the first level;
a driving unit configured to independently move each of the moving blocks between the first level and the second level; and
a controller configured to control a first order by which respective ones of the moving blocks ascend, temperatures of the moving blocks, and pressures applied to the molding resin by respective ones of the moving blocks.

12. The device for molding claim 11, wherein the controller, after all of the moving blocks ascend to the second level, is configured to raise temperatures of the moving blocks to a curing temperature of the molding resin or higher.

13. The device for molding claim 11, wherein the controller is configured to raise the respective ones of the moving blocks by the first order, and raise temperatures of the moving blocks to a curing temperature of the molding resin or higher according to a second order by which the respective ones of the moving blocks reach the second level.

14. The device for molding claim 11, wherein the moving blocks are arranged in a first direction that crosses moving directions of the moving blocks.

15. The device for molding claim 11, wherein the moving blocks are arranged in array including at least two rows and at least two columns.

16. A device for molding a semiconductor package, the device comprising:
an upper mold configured to retain a substrate thereon, the substrate including at least one semiconductor chip thereon;
a lower mold including a plurality of moving blocks and at least one outer circumferential structure, the moving blocks and the at least one outer circumferential structure defining a cavity, each of the moving blocks configured to independently ascend and descend, the moving blocks defining a bottom surface of the cavity, and the outer circumferential structure defining a sidewall of the cavity; and
a controller configured to control an order by which respective ones of the moving blocks ascend and descend.

17. The device for molding claim 16, wherein the moving blocks include a central moving block and one or more other moving blocks, the one or more other moving blocks at least one of surrounding the central moving block or being at both sides of the central moving block.

18. The device for molding claim 17, wherein the controller is configured to,
at least one of
(1) raise the central moving block, and subsequently raise the one or more other moving blocks in an order of proximity to the central moving block, or
(2) raise an outermost moving block from among the moving blocks, and subsequently raise other moving blocks from among the moving blocks in an order of proximity to the outermost moving block.

19. The device for molding claim 16, wherein the controller is further configured to,
adjust a pressure applied to a molding resin by each of the moving blocks, and
control a temperature of each of the moving blocks.

20. The device for molding claim 16, further comprising:
a supporting block configured to ascend and descend to support the moving blocks at a side opposite to the cavity with respect to the moving blocks.

* * * * *